United States Patent [19]
Ueda

[11] Patent Number: 5,315,135
[45] Date of Patent: May 24, 1994

[54] SEMICONDUCTOR DEVICE HAVING I²L GATE WITH HETEROJUNCTION

[75] Inventor: Shigeyuki Ueda, Kyoto, Japan

[73] Assignee: Rohm Co., Ltd., Kyoto, Japan

[21] Appl. No.: 7,841

[22] Filed: Jan. 22, 1993

[30] Foreign Application Priority Data

Jan. 23, 1992 [JP] Japan .................................. 4-34490

[51] Int. Cl.⁵ .................................. 257 575; 257 556; 257 77
[52] U.S. Cl. .................................. 257/198
[58] Field of Search .................. 257/197, 198, 65, 90, 257/96, 77, 555, 574, 575, 576, 113, 97; H01L 29/72, 29/161, 27/02

[56] References Cited

FOREIGN PATENT DOCUMENTS 1189977A 7/1989 Japan .

Primary Examiner—Jerome Jackson
Assistant Examiner—John F. Guay
Attorney, Agent, or Firm—Brumbaugh, Graves, Donohue & Raymond

[57] ABSTRACT

In a semiconductor device having I²L gate, on a first conducting type semiconductor layer, a first semiconductor region with a second conducting type and a wider band gap than that of the semiconductor layer and a second semiconductor region with a second conducting type and a narrower band gap than that of the semiconductor layer are formed, and on the second semiconductor region, a third semiconductor region with the first conducting type is formed.

2 Claims, 2 Drawing Sheets

SEMICONDUCTOR DEVICE HAVING I²L GATE WITH HETEROJUNCTION

BACKGROUND OF THE INVENTION

The present invention relates to a semiconductor device, and particularly relates to a semiconductor device having I²L (Integrated Injection Logic) gate.

Since, as well known, the I²L gate is a bipolar circuit and a simply structured logic circuit which does not need isolation of transistors, it is possible to reduce power consumption and to increase integration density, and the gate has been widely used for the semiconductor integrated circuits.

A conventional I²L gate structure will simply be explained with reference to FIGS. 3 and 4. FIG. 3 is a cross sectional view showing an I²L gate device structure and FIG. 4 is an equivalent circuit diagram thereof.

As shown in FIG. 3, on an N+ type silicon substrate 1, an N type epitaxial layer 2 is deposited, and on the epitaxial layer 2, P type impurity diffusion layers 3 and 4 are formed respectively. Further, two N type impurity diffusion layers 5 are formed in a region of the impurity diffusion layer 4. In the Figure, the hatching region shown by reference numeral Tr1 constitutes a PNP type lateral transistor. Also, the hatching region shown by reference numeral Tr2 constitutes an NPN type transistor whose direction is reversed to that of a usual planar type transistor. As apparent from the Figure, a base region and a collector region of the lateral PNP transistor Tr1 are also used for an emitter region and a base region of the reverse NPN transistor Tr2 respectively, so that the isolation and the wiring of each transistor are omitted.

As shown in FIG. 4, the lateral PNP transistor Tr1 is operated as a constant current source and the direction of the collector current is changed by the voltage applied to terminal B. Namely, when a low level voltage is applied to the terminal B, the collector current of the transistor Tr1 flows to an input terminal B side and the reverse NPN transistor Tr2 becomes an OFF state so that a high level voltage is outputted to collector terminals C₁ and C₂. On the contrary, when a high level voltage is applied to the terminal B, the collector current of the transistor Tr1 flows to the base of the transistor Tr2 and the transistor Tr2 becomes an ON state so that a low level voltage is outputted to the collector terminals C₁ and C₂. Thus, the I²L gate is basically an inverter, but gates such as OR, NOR etc. can be constituted by combining it.

However, such structured conventional gate has the following problems.

This kind of logic gate is expected to have as high speed operation as possible. Therefore, a way of reducing base resistance by increasing the impurity concentration in the base region is considered, but since the conventional I²L gate is structured by homojunction of silicon crystal, when the impurity concentration in the base region is increased too much, reverse injection of carriers (holes in the NPN transistor and electrons in the PNP transistor) from the base region to the emitter region is increased and the injection efficiency in the emitter is lowered. As a result, the current gain ($h_{FE}$) is disadvantageously decreased. Since in the conventional I²L gate, the impurity concentration in the base region cannot be too increased, high speed operation could not be easily realized.

SUMMARY OF THE INVENTION

The present invention has been made in view of such situations. An object of the present invention is therefore to provide a semiconductor device having I²L gate in which high speed operation can be realized.

In a semiconductor device having an I²L gate according to the present invention, on a first conductivity type semiconductor layer, a first semiconductor region with a second conductivity type and a wider band gap than that of the semiconductor layer and a second semiconductor region with a second conductivity type and a narrower band gap than that of the semiconductor layer are formed, and on the second semiconductor region, a third semiconductor region with the first conductivity type is formed. Concretely, on a first conductivity type silicon substrate, a second conductivity type β-SiC region and a second conductivity type SiGe region are formed and on the SiGe region, a first conductivity type polysilicon region is formed.

The lateral transistor of the I²L gate is constituted by the heterojunction of a first semiconductor region (concretely, β-SiC) corresponding to an emitter region, a semiconductor layer (concretely, silicon substrate) corresponding to a base region and a second semiconductor region (concretely, SiGe) corresponding to a collector region. Also, the reverse transistor of the I²L gate is constituted by the heterojunction of a semiconductor layer (concretely, silicon substrate) corresponding to an emitter region, a second semiconductor region (concretely, SiGe) corresponding to a base region and a third semiconductor region (concretely, polysilicon region) corresponding to a collector region.

Since the first semiconductor region, which is an emitter region of the lateral transistor, has a wider band gap than that of a semiconductor region which is a base region, and a semiconductor layer which is an emitter region of the reverse transistor, has a wider band gap than that of a second semiconductor region which is a base region, the injection efficiency for emitters of both transistors is increased. Therefore, the high speed operation in the I²L gate can be realized without reducing the current amplification factor of both transistors by reducing the base resistance.

DETAILED DESCRIPTION OF THE INVENTION

A preferred embodiment of the present invention will be described below.

Figure 1:
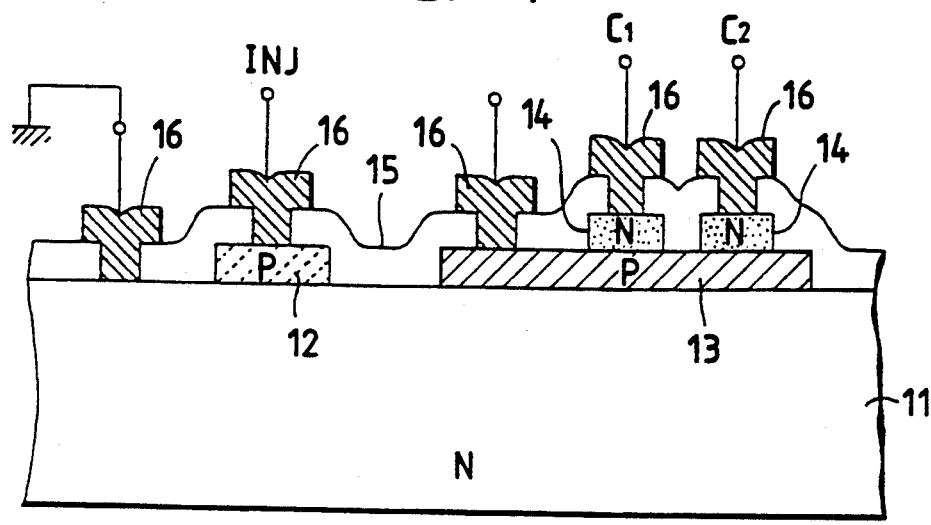
FIG. 1 is a cross sectional view showing a device structure of the semiconductor device having I²L gate according to an embodiment of the present invention.
Figure 3:
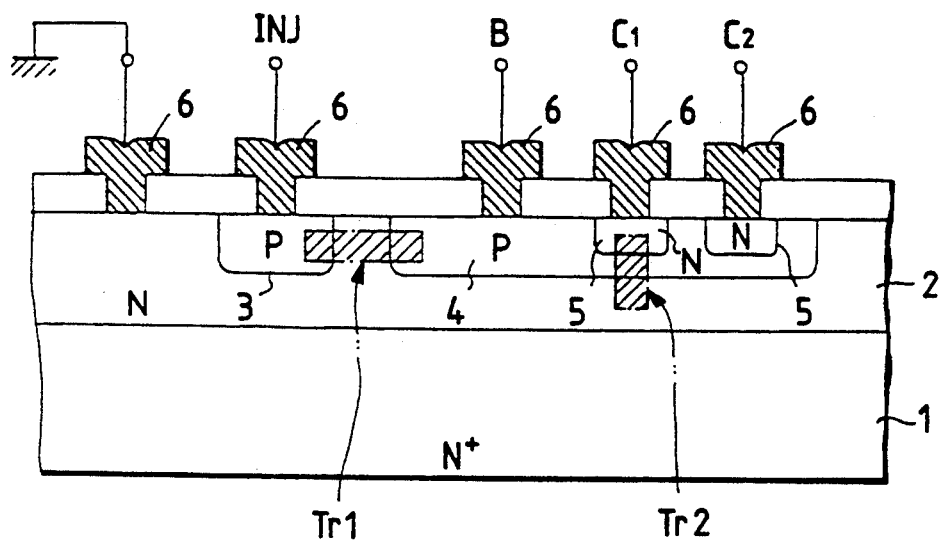
FIG. 3 is a cross sectional view showing a device structure of a conventional I²L gate.
Figure 4:
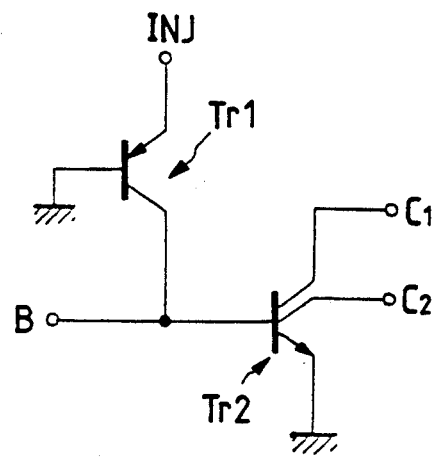
FIG. 4 is a circuit diagram of the conventional I²L gate.

FIG. 1 is a cross sectional view showing a device structure of a semiconductor device having I²L gate according to an embodiment of the present invention.

In the Figure, reference numeral 11 designates a silicon substrate. The silicon substrate 11 corresponds to a first conductivity type semiconductor layer in the present invention. On the silicon substrate 11, a P-type β-SiC layer 12 corresponding to a first semiconductor region in the present invention and a P-type SiGe layer 13 corresponding to a second semiconductor region in the present invention are formed respectively. On the SiGe layer 13, two N-type polysilicon layers 14 corresponding to a third semiconductor region in the present invention are formed. Reference numerals 15 and 16 designate a silicon oxide film and a metal wiring, respectively.

The β-SiC layer 12, the silicon substrate 11 and the SiGe layer 13 correspond to the emitter region, the base region and the collector region of a lateral PNP transistor of the I$^2$L gate, respectively. In turn, the silicon substrate 11, the SiGe layer 13 and the polysilicon layer 14 correspond to the emitter region, the base region and the collector region of a reverse NPN transistor of the I$^2$L gate, respectively. The band gap of β-SiC layer 12 which is the emitter region of the lateral PNP transistor is wider than that of the silicon substrate 11 which is the base region. Further, the band gap of the silicon substrate 11 which is the emitter region of the reverse NPN transistor is wider than that of the SiGe layer 13 which is the base region. Incidently, the band gap of the β-SiC layer 12 is about 2.2 eV, that of the silicon substrate 11 is about 1.12 eV, and that of the SiGe layer 13 is about 0.8 to 0.9 eV.

By using the above described heterojunction and making the band gap of emitter region of each of the lateral PNP transistor and the reverse NPN transistor wider than the band gap of base region of each transistor, reverse injection of carriers (hole in the NPN transistor and electron in the PNP transistor) from the base region to the emitter region is reduced so that the injection efficiency for the emitter of both transistors can be increased. Therefore, even if the concentration in each base region is increased and the resistance value thereof is set to a low level, since the injection efficiency for emitter is high, current amplification factor of a transistor is not lowered and high speed operation in the I$^2$L gate can be realized.

Next, a method of producing the semiconductor device shown in FIG. 1 will be explained with reference to FIGS. 2(a) to 2(e).

Figure 2A:
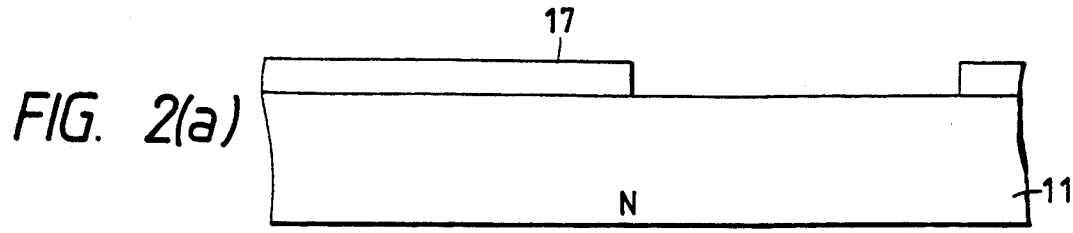
FIGS. 2(a) to 2(e) are cross sectional views for explanation of the production method of the semiconductor device according to the embodiment.

With reference to FIG. 2(a), a silicon oxide film 17 is grown on an N-type silicon substrate 11 to a thickness of about 2000 angstrom by a CVD (Chemical Vapor Deposition) method and a portion on which a SiGe layer 13 is deposited, is opened by a photo-etching method.

Figure 2B:
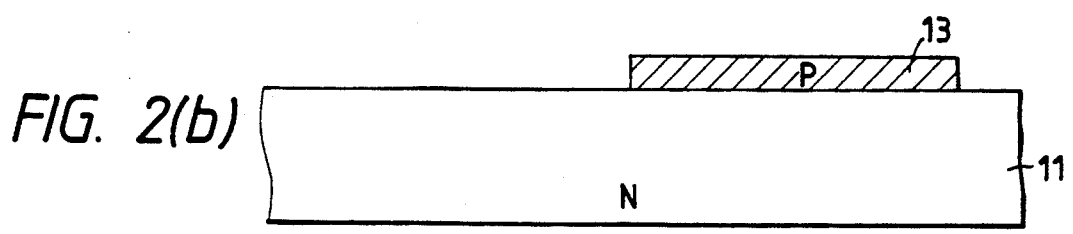

With reference to FIG. 2(b), the SiGe layer 13 is epitaxially grown to a thickness of about 1000 angstrom by an MBE (Molecular Beam Epitaxy) method. Then, boron (B+) is injected by an ion implantation to form the P-type SiGe layer 13. The silicon oxide film 17 is removed by HF solution and only the SiGe layer 13 deposited at the opening portion is left.

Figure 2C:
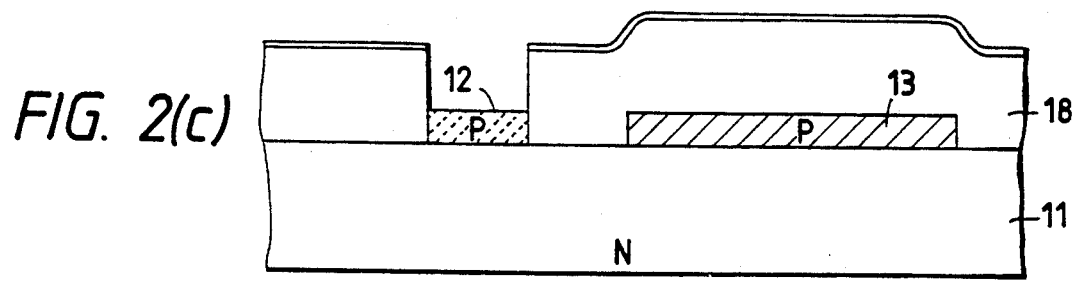

With reference to FIG. 2(c), a silicon oxide film 18 is grown to a thickness of about 5000 angstrom by the CVD method. A portion on which a β-SiC layer 12 is deposited, is opened by the photo-etching method and the β-SiC layer 12 is deposited to a thickness of about 1000 angstrom by the CVD method. Concretely, Si$_2$H$_6$ are used as a material gas, and B$_2$H$_6$ is used as a dopant. By the reaction of them at about 1150° C., the P-type β-SiC layer 12 is obtained.

Figure 2D:
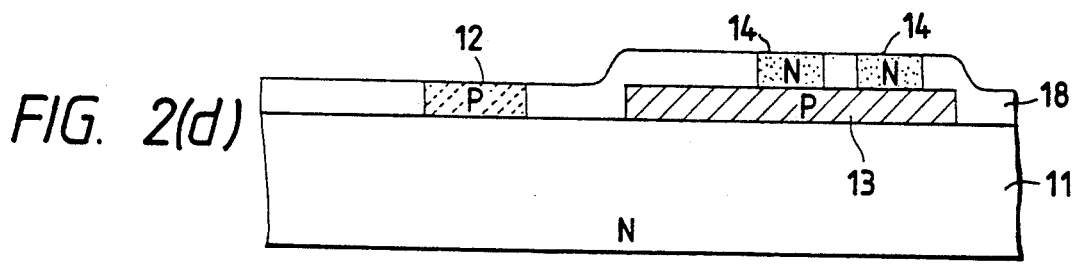

With reference to FIG. 2(d), after the silicon oxide film 18 is removed by a thickness of about 2000 angstrom, a portion through which a polysilicon layer 14 is deposited on the SiGe layer 13, is opened by the photo-etching method. The polysilicon layer 14 is deposited by the CVD method. When, for example, pyrolysis of SiH$_4$ is performed, PH$_3$ is added as a dopant so that the N-type polysilicon layer 14 is obtained. An unnecessary portion of the polysilicon layer 14 is removed by the photo-etching method to leave only the polysilicon layer 14 in the opening portion.

Figure 2E:
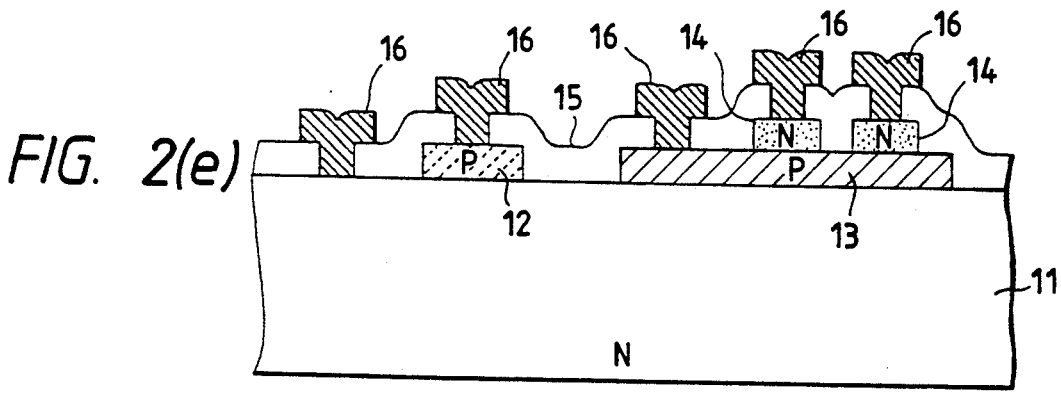

With reference to FIG. 2(e), after a silicon oxide film 15 is deposited by the CVD method, portions on which electrodes are to be formed are opened. Metal material such as aluminum or nickel is deposited by the sputtering method etc. and metal wiring 16 is formed by the photo-etching method.

Although in the above mentioned embodiment, as the first semiconductor region, the β-SiC layer 12 having a wider band gap than that of the silicon substrate 11 is used, an α-SiC layer may be used instead thereof.

Also, although in the embodiment, two collector regions (the polysilicon layer 14) of the reverse NPN transistor were formed, the present invention is not limited to the number and can adopt optional number thereof.

Further, in the embodiment, the I$^2$L gate comprising a lateral PNP transistor and a reverse NPN transistor was explained, the present invention can be adapted to the I$^2$L gate comprising a lateral PNP transistor and a reverse NPN transistor.

As apparent from the above description, according to the present invention, the first semiconductor region to be an emitter region of a lateral transistor forming an I$^2$L gate has a wider band gap than that of the semiconductor region to be the base region, and the semiconductor layer to be an emitter region of a reverse transistor has a wider band gap than that of the second semiconductor region to be the base region. Thus, the injection efficiency from emitter of both transistors can be increased. Therefore, even if the concentration in the base region is increased and the base resistance is lowered, since the injection efficiency for emitter is high, the high speed operation of the I$^2$L gate can be realized without lowering the current amplification factor of both transistors.

What is claimed is:

1. A semiconductor device having I$^2$L gate, comprising:
   a semiconductor layer having a first conductivity type and having a band gap;
   a first semiconductor region formed on and in contact with said semiconductor layer, said first semiconductor region having a second conductivity type and a wider band gap than that of said semiconductor layer;
   a second semiconductor region formed on and in contact with said semiconductor layer, said second semiconductor region having a second conductivity type and a narrower band gap than that of said semiconductor layer; and
   a third semiconductor region formed on said second semiconductor region and having a first conductivity type.

2. A semiconductor device having I$^2$L gate as claimed in claim 1, wherein said semiconductor layer is a silicon substrate, said first semiconductor region is a β-SiC region, said second semiconductor region is a SiGe region, and said third semiconductor region is a polysilicon region.

* * * * *